US012768874B2

(12) United States Patent
Nguyen et al.

(10) Patent No.: US 12,768,874 B2
(45) Date of Patent: Oct. 20, 2026

(54) DEVICE AND METHOD FOR CHARACTERIZING THE CURRENT COLLAPSE OF GAN TRANSISTORS

(71) Applicant: COMMISSARIAT A L'ENERGIE ATOMIQUE ET AUX ENERGIES ALTERNATIVES, Paris (FR)

(72) Inventors: Van-Sang Nguyen, Grenoble Cedex (FR); Anthony Bier, Grenoble Cedex (FR); Stéphane Catellani, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 152 days.

(21) Appl. No.: 18/862,418

(22) PCT Filed: May 2, 2022

(86) PCT No.: PCT/FR2022/050841
§ 371 (c)(1),
(2) Date: Nov. 1, 2024

(87) PCT Pub. No.: WO2023/214122
PCT Pub. Date: Nov. 9, 2023

(65) Prior Publication Data

US 2025/0298069 A1 Sep. 25, 2025

(51) Int. Cl.

| | |
|---|---|
| ***G01R 31/26*** | (2020.01) |
| ***G01R 1/20*** | (2006.01) |
| ***G01R 27/08*** | (2006.01) |

(52) U.S. Cl.
CPC ......... *G01R 31/2621* (2013.01); *G01R 1/206* (2013.01); *G01R 27/08* (2013.01)

(58) Field of Classification Search
CPC .... G01R 31/2621; G01R 1/206; G01R 27/08; G01R 31/2637
See application file for complete search history.

(56) References Cited

U.S. PATENT DOCUMENTS

| | | | | |
|---|---|---|---|---|
| 2019/0094276 | A1* | 3/2019 | Bahl | G01R 15/04 |
| 2021/0080498 | A1* | 3/2021 | Tadepalli | G01R 31/2837 |
| 2022/0099726 | A1* | 3/2022 | Lai | G01R 31/2621 |

OTHER PUBLICATIONS

P. J. Martínez, P. F. Miaja, E. Maset and J. Rodríguez, "A Test Circuit for GaN HEMTs Dynamic RON Characterization in Power Electronics Applications," in IEEE Journal of Emerging and Selected Topics in Power Electronics, vol. 7, No. 3, pp. 1456-1464, Sep. 2019 (Year: 2019).*

(Continued)

*Primary Examiner* — Daniel R Miller
(74) *Attorney, Agent, or Firm* — Oblon, McClelland, Maier & Neustadt, L.L.P.

(57) ABSTRACT

A device for evaluating a dynamic resistance in a conducting state of a GaN-based transistor. The device including a test circuit provided with a circuit, the GaN-based transistor, forming an arm of the circuit, the device being provided with a stage for controlling the switch elements of the circuit to alternately set the switch elements of the circuit in a first configuration and then in a second configuration, the control stage being configured to trigger a connection of a drain-source voltage measuring stage to the GaN-based transistor after the circuit is set in the first configuration, and to trigger a disconnection of the drain-source voltage measuring stage from the GaN-based transistor before the circuit is set in the second configuration.

12 Claims, 5 Drawing Sheets

(56) References Cited

OTHER PUBLICATIONS

P. Skarolek, F. Frolov and J. Lettl, "GaN Based Inverter Current-Collapse Behavior with Switching Frequency and Blocking Voltage," 2021 International Conference on Applied Electronics (AE), Pilsen, Czech Republic, 2021, pp. 1-4 (Year: 2021).*
International Search Report and Written Opinion issued on Jan. 4, 2023 in PCT/FR2022/050841 filed on May 2, 2022 (with English translation of Search Report), 17 pages.
Kumar et al., "H-Bridge Derived Topology for Dynamic On-Resistance Evaluation in Power GaN HEMTs", IEEE Transactions on Industrial Electronics, vol. 70, No. 2, Feb. 2023, pp. 1532-1541, XP011922437.
Yang et al., "Experimental Evaluation and Analysis of Switching Transient's Effect on Dynamic ON-Resistance in GaN HEMTs", IEEE Transactions on Power Electronics, vol. 34, No. 10, Oct. 2019, pp. 10121-10135, XP011733491.
Li et al., "Dynamic ON-State Resistance Test and Evaluation of GaN Power Devices Under Hard- and Soft-Switching Conditions by Double and Multiple Pulses", IEEE Transactions on Power Electronics, vol. 34, No. 2, Feb. 2019, pp. 1044-1053, XP011701590.
Jones et al., "Hard-Switching Dynamic $R_{ds,on}$ Characterization of a GaN FET with an Active GaN-Based Clamping Circuit", IEEE Applied Power Electronics Conference and Exposition (APEC), Mar. 2019, pp. 2757-2763, XP033555164.
Nguyen et al., "A High Precision Dynamic Characterization Bench with a Current Collapse Measurement Circuit for GaN HEMT Operating at 175° C.", PCIM Europe digital days, May 3-7, 2021, pp. 416-423.

* cited by examiner

DEVICE AND METHOD FOR CHARACTERIZING THE CURRENT COLLAPSE OF GAN TRANSISTORS

TECHNICAL FIELD

The present application relates to the field of GaN-based transistors and relates in particular to an improved measuring device allowing evaluating the dynamic resistance in the conducting state of such transistors.

PRIOR ART

GaN-based transistors have the particular advantage of withstanding high current densities as well as very high chopping frequencies. They find applications in the field of power circuits such as power converters and inverters.

However, these transistors are subject to a current collapse phenomenon ("current collapse" according to the Anglo-Saxon terminology) due to electron traps in their semiconductor structure. Such a phenomenon is mentioned for example in the document by T. Hasan, "Mechanism and Suppression of Current Collapse in AlGaN/GaN High Electron Mobility Transistors", PHD thesis-University of Fukui, Japan, 2013.

The origin of such traps could be the result of several factors, like for example crystalline defects, dislocations, or the presence of impurities. Such traps could also be found in the interface between different semiconductor materials and passivation layers. In GaN-based transistors, the traps are located mainly in the GaN or in the interface between this layer and another layer of a large Gap material, for example AlGaN-based.

The current collapse phenomenon significantly affects circuits in particular power circuits such as converters or inverters, which is all the more when an operation at high temperature and at low voltage is required. This might even result in a thermal breakage of the components.

The document: "The effect of dynamic On-state resistance to systems losses in GaN-based hard switching applications", by R. Hou, J. Lu, PCIM 2019, and the document: "The impact of GaN HEMT dynamic On-state resistance on converter performance", by Cai et al., IEEE Applied Power Electronics Conference and Exposition, Tampa, FL, March 2017, disclose different methods for evaluating the drain-source dynamic resistance of a GaN transistor.

This poses the problem of finding a device allowing carrying out a measurement of the drain-source dynamic resistance of a GaN transistor having an improved accuracy and which is easily adaptable to serial testing of such components.

DESCRIPTION OF THE INVENTION

According to one embodiment, the present invention relates to a device for evaluating the dynamic resistance in the conducting state of a GaN-based transistor, comprising a test circuit having:

- a first circuit arm, said first arm being provided with a first switch element and with a second switch element connected together at a first node, said test circuit being provided with a third switch element connected to the second node, said third switch element being able to form a second arm of said test circuit with said GaN-based transistor when said GaN-based transistor is connected to the second node,

- a power supply delivering a supply voltage to the first arm and to the second arm,
- a branch between the first node and the second node provided with an inductive load and with a current sensor, to measure a current flowing through this inductive load,
- a measuring switch for alternately connect said GaN-based transistor to a drain-source voltage measuring stage in the conducting state of said GaN-based transistor, and disconnect said GaN-based transistor from said drain-source voltage measuring stage when said measuring switch is set in the non-conducting state,
- a control stage of said first, second and third switch elements, of said GaN-based transistor and of the measuring switch, the control stage being configured to:

according to a so-called "measurement" phase, alternately set, once or several times, the test circuit in a first configuration, then in a second configuration, the first configuration being a configuration in which the first switch element and said GaN-based transistor are made conducting whereas the second switch element and the third switch element are made non-conducting, so as to set said power supply in series, said branch, and said GaN-based transistor, the second configuration being a configuration during which the second switch element and the third switch element are in the conducting state whereas the first switch element and said GaN-based transistor are set in the non-conducting state so as to set said branch in closed circuit with said power supply, the control stage being configured to trigger a connection of the drain-source voltage measuring stage to said GaN-based transistor after the test circuit is set in the first configuration, and to trigger a disconnection of the drain-source voltage measuring stage of said GaN-based transistor before the test circuit is set in the second configuration.

In comparison with pulse-type test devices, the test circuit of the device according to the invention enables a characterization that is closer to the behavior of GaN transistors in their application field.

According to an advantageous embodiment, the control stage is further configured, prior to the measurement phase, to implement a soaking phase lasting an adjustable predetermined duration, by making the first switch and the third switch conducting whereas the second switch and the GaN-based transistor are kept non-conducting so as to set the first node and the second node at said supply voltage.

According to a possible implementation, the control stage is configured to trigger a connection of the drain-source voltage measuring stage to said GaN-based transistor a first predetermined adjustable delay after the test circuit is set in the first configuration, and to trigger a disconnection of the drain-source voltage measuring stage from said GaN-based transistor, a second predetermined adjustable delay before the test circuit is set in the second configuration.

According to a possible embodiment, the drain-source voltage measuring stage comprises an operational amplifier mounted as a follower and whose non-inverting input could be connected to the drain electrode of the GaN-based transistor.

Advantageously, the control stage is configured to trigger a switch from the first configuration into the second configuration or from the second configuration into the first configuration according to the variation of a signal originating from a circuit for regulating the current of said inductive load, this signal itself resulting from a comparison between said current flowing through the inductive load and a setpoint value.

According to a possible implementation, the regulation circuit is configured to establish the difference between an averaged value of the current flowing through the inductive load and said setpoint, and includes a corrector stage, in particular of the proportional integral type, configured to calculate a duty cycle from this difference, this duty cycle, comprised between zero and one, being representative of a proportion between the duration of said first configuration and the total duration of the successive first configuration and second configuration, the value of the duty cycle being transmitted via said signal originating from a regulation circuit to a pulse-width modulation circuit of the control stage to control the gate of the first switch element, of the second switch element, of the third switch element, and of said GaN-based transistor.

According to a possible implementation, the device may further comprise a means for heating the GaN-based transistor. In particular, this heating means may be provided with an infrared radiation source configured to emit a localized infrared light beam on the GaN-based transistor.

The GaN-based transistor is typically brought to be temporarily connected on the test circuit.

Thus, according to one possibility, said circuit is arranged on a support provided with connection areas or structures on which a source electrode, a drain electrode and a gate electrode of the GaN transistor can respectively be connected in a removable manner.

Advantageously, the GaN-based transistor is embedded and/or mounted on a package and said test circuit is arranged on a support, the connection structures consisting of connection and receiving structures respectively intended to enable a secure assembly of the transistor on said support.

According to another possibility, the transistor is arranged on a wafer ("wafer" according to the Anglo-Saxon terminology) including a plurality of electronic chips, each electronic chip being provided with at least one GaN transistor, the GaN transistor being connected to said support of the test circuit.

According to another aspect, the present application relates to a microelectronic method comprising at least one step of evaluating the dynamic resistance in the conducting state of a GaN transistor using a device as defined before, the method comprising steps of:

- connecting the GaN-based transistor to connection areas in order to assess its drain-source dynamic resistance in the conducting state, then
- disconnecting the transistor from said connection areas, then,
- cutting the support in order to separate said electronic chips.

BRIEF DESCRIPTION OF THE DRAWINGS

The present invention will be better understood in light of the following description and from the appended drawings wherein.

Identical, similar or equivalent portions of the different figures bear the same reference numerals so as to facilitate passage from one figure to another.

The different portions shown on the figures are not necessarily plotted according to a uniform scale, to make the figures more legible.

DETAILED DESCRIPTION OF PARTICULAR EMBODIMENTS

Figure 1:
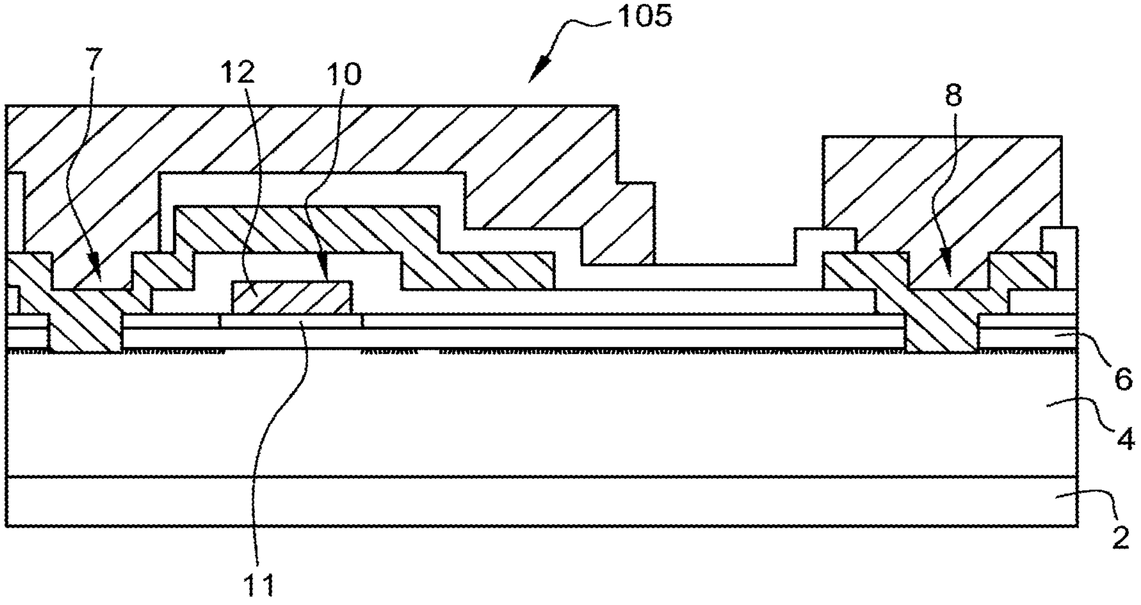
FIG. 1 is intended to illustrate an example of a structure of a GaN-based transistor whose drain-source dynamic resistance in the conducting state can be assessed by means of a device implemented according to the invention.

FIG. 1 now depicts a schematic sectional view of an example of a structure of a GaN-based transistor 105 whose drain-source dynamic resistance in the conducting state $R_{DS\_ON\_dyn}$ is assessed.

The transistor 105 is made from a semiconductor substrate 2, for example silicon-based, on which a semiconductor block comprising a heterojunction is arranged. The heterojunction is made in a stack comprising a first layer 4 of a III-N semiconductor material having a first band gap and a second layer 6 of a III-N semiconductor material having a second band gap, larger than said first band gap. For a so-called "GaN" or "GaN-based" transistor, the first layer 4 is typically GaN-based, whereas the second layer 6 may, for example, be made of AlGaN.

The transistor further comprises source 7 and drain 8 electrical contacts, which are arranged on and in contact with regions of the second layer 6. Each of the electrical contacts 7 and 8 may be a metallic layer or a stack of metallic layers. A two-dimensional electron gas 2-DEG may be formed in a channel region located in the first layer 4, typically under the interface between the second layer 6 and the first layer 4.

The transistor further comprises a gate electrode 10 which may be arranged in contact with, and herein over a portion of, the second layer 6 to control the two-dimensional electron gas. The gate electrode 10 is formed by an upper region 12 which is metal-based and which is in contact with a semiconductor lower region 11, for example p-GaN based.

In order to be able to prevent the current collapse phenomenon ("current collapse"), the value of the dynamic resistance of such a GaN transistor 105 should be assessed. Advantageously, such an assessment may be performed directly on the wafer ("wafer" according to the Anglo-Saxon terminology), in other words even before this transistor is separated from other transistors with which it is formed collectively on this same wafer and before this wafer is divided.

Alternatively, it is possible to assess this dynamic resistance value after division steps ("dicing" or "wafer dicing" according to the Anglo-Saxon terminology) and optionally after the transistor is packaged according to a packaging step ("packaging" according to the Anglo-Saxon terminology).

Figure 2:
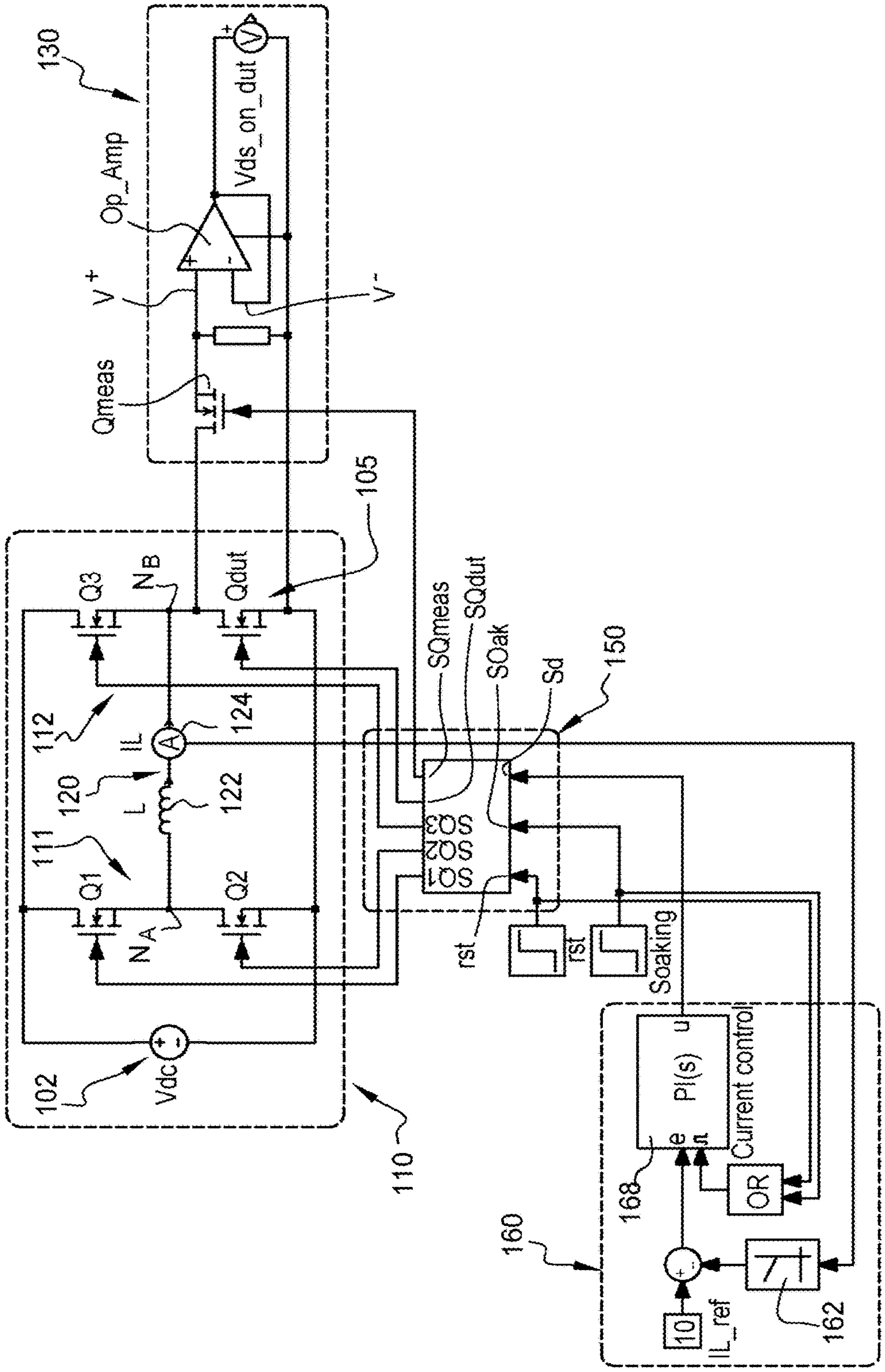
FIG. 2 is intended to illustrate a device for evaluating the drain-source dynamic resistance in the conducting state of a GaN-based transistor wherein the transistor is arranged as a switch element of a test circuit with several switches and the arrangement of which is similar to that of an inverter-type setup.

To allow measuring the drain-source dynamic resistance of a transistor of the same type as that one described before in connection with FIG. 1, it is provided to integrated it into a circuit 110, as illustrated in FIG. 2, so as to form a test circuit with switches the arrangement of which is similar to that of a bridge inverter.

The circuit 110 is powered by a DC power supply 102-DC/-DC for example in the range of 10 volts up to 3 kV, in particular between 100 volts and 1,700V.

The circuit 110 is provided with a first arm 111 comprising a first switch element Q1, in this example a first transistor, and a second switch element Q2, herein a second transistor, the second switch element being connected to the first switch element at a first node NA.

The circuit 110 is also provided with a second arm 112 comprising a third switch element Q3, herein a third transistor. The GaN transistor 105 whose drain dynamic resistance $R_{DS\_ON\_dyn}$ is to be assessed is intended to complete the second arm and form the fourth switch element of the test circuit. The third transistor Q3 and the GaN transistor 105 are herein connected at a second node NB.

Advantageously, the GaN transistor 105 is temporarily set in connection with the other switch elements Q1, Q2, Q3 to form the circuit 110. In this case, once the measurement(s) of the drain-source dynamic resistance in the conducting state $R_{DS\_ON\_dyn}$ have been performed, it is possible to replace the transistor 105 with another transistor of the same type whose drain-source dynamic resistance in the conducting state $R_{DS\_ON\_dyn}$ is to be assessed.

The transistors, herein forming respectively the first, second and third switch element Q1, Q2, Q3, are typically made in a technology distinct from that one of the GaN transistor 105. Thus, these transistors may, in particular, consist of MOS transistors, advantageously power MOSs whose channel region is for example formed in a silicon layer. In the illustrated particular embodiment, NMOS enhancement transistors are used.

It is provided to measure a current IL in a circuit branch 120 between the first node $N_A$ and this second node $N_B$ in order to obtain an image of the drain-source current IDS_ON of the GaN transistor 105 when the latter is conducting.

To assess the current $I_L$, a circuit branch 120 between the first node $N_A$ and the second node NB comprises a current sensor 124. A "hall effect" type sensor, like for example a sensor commercialized by the company LEM, in particular the type LEM CKSR, 50A could allow measuring the current flowing through an inductive load 122 with an inductance L. Preferably, this inductive load 122 is provided with a very low high-frequency parallel parasitic capacitance for example in the range of 0.3 pF within a frequency range between 10 MHz and 60 MHz. The current IL is the image of the current flowing through the GaN transistor 105 when the latter is set in the conducting state and the branch 120 is set in series with this transistor 105.

A stage 130 for measuring the drain-source voltage of the GaN transistor 105 when the latter is set in the conducting state is also provided for and coupled with the drain electrode D and with the source electrode S of the GaN transistor 105.

The stage 130 for measuring the drain-source voltage, is herein provided with an operational amplifier Op-Amp according to a follower setup, with an output looping back on its inverting input.

The operational amplifier Op-Amp outputs a voltage Vds_ON_dut proportional to a difference of potentials between a potential of a drain electrode D of the transistor 105 set in the conducting state and a potential of a source electrode S of the first transistor 105 set in the conducting state.

In the illustrated example, the drain D of the transistor 105 can be coupled during a measurement phase at the non-inverting input V+ of the operational amplifier Op-Amp.

A so-called "measuring" switch $Q_{meas}$ is arranged between the drain electrode D of the transistor 101 and the non-inverting input V+ of the operational amplifier Op-Amp. In this example, this measuring switch $Q_{meas}$ is formed by a coupling transistor, herein of the N type, in particular an enhancement NMOS, which gate is controlled by a measurement control signal SQmeas, to activate the coupling transistor $M_1$ and trigger a measurement phase.

When the switch $Q_{meas}$ is set in the conducting state, the drain electrode D of the transistor 105 is subsequently connected to the amplifier.

The measurement of the drain-source voltage is herein performed when setting the GaN transistor 105 in the conducting mode. Once the measurement phase is completed, the measurement control signal SQmeas is modified so as to disconnect the drain electrode D of the transistor 105 from the amplifier Op-Amp.

Advantageously, the operational amplifier Op-Amp is provided for with a high slew rate ("Slew Rate" according to the Anglo-Saxon terminology), i.e. typically of at least several hundred volts per µs, for example in the range of 400 V/µs. Advantageously, the operational amplifier Op-Amp may be powered between V+ and V− by an external battery, which allows minimizing disturbances in the measurements.

The switch elements Q1, Q2, Q3 and the transistor 105 whose drain-source dynamic resistance RDS_ONdyn should be measured, and in particular their respective active and inactive (i.e. respectively conducting or non-conducting) states are respectively controlled by control signals SQ1, SQ2, SQ3, $SQ_{DUT}$.

A control stage 150 connected to the test circuit 110 may be provided to produce these control signals SQ1, SQ2, SQ3, $SQ_{DUT}$, respectively of the switch elements Q1, Q2, Q3 and of the transistor 105, herein applied on their respective gate electrodes, as well as the measurement control signal SQmeas. These signals are typically produced in the form of pulses and according to sequences corresponding to the different phases of operation of the device, in particular to implement a so-called "soaking" phase and a so-called current regulation and measurement" phase also so-called "measurement phase". The control stage 150 is typically a digital circuit or provided with a digital block or is integrated into a digital circuit, for example of the microcontroller type or a programmable logic circuit.

In the illustrated example of operation, the control stage 150 itself receives signals Srst, Ssoak and Sd.

The signal Srst is a reset signal of the control stage 150 to reset it in a so-called "stop" phase. The respective control signals SQ1, SQ2, SQ3, $SQ_{DUT}$, SQmeas are set during this stop phase in an inactive state, herein a low state, so that the switches Q1, Q2, Q3, $Q_{DUT}$, $Q_{meas}$ are deactivated (i.e. in the non-conducting state).

The signal Ssoak is a signal triggering the end of the so-called "soaking" phase, which takes place prior to the measurement phase, and whose duration could be adjusted and modulated from one measurement of the dynamic resistance to another.

In particular, the duration of soaking may depend on the intended application of the transistor being tested. It is also possible to carry out different tests with distinct soaking durations from one test to another in order to determine the characteristics of the transistor. For example, a "dSpace"-type servo-controller produced by the company dSpace GmbH or an FPGA-type programmable logic circuit may be used to modulate this duration.

The signal Sd may be an indicator of a duty cycle. The control stage 150 could modify the respective states of some of its control signals SQ1, SQ2, SQ3, $SQ_{DUT}$, SQmeas subsequently to the reception of such a signal.

This signal Sd itself may be produced by a regulation stage 160. Such a stage 160 receives a measurement of the current $I_L$ measured by the current sensor 124, may recover an average value of this current via a block 162, which produces a measured current average in order to be able to compare this average value with a reference current value IL_ref serving as a setpoint value. The result of this comparison is transmitted to a corrector stage 168, herein of the PI ("proportional-integral") type which produces the signal Sd. The regulation may be reset by reception of the reset signal Srst of the control stage 150 or of the signal Ssoak triggering the end of the soaking phase.

The control stage 150 may be configured to trigger a switch from the first configuration into the second configuration according to the following method:

- The current measured in the inductance IL may be averaged and compared with a predetermined current setpoint IL_ref, the result of this comparison is used by the regulation stage 160 provided with a corrector stage 168, in particular a PI-type corrector, configured to calculate a duty cycle based on this current difference.
- This duty cycle, comprised between zero and one, is representative of a proportion between the duration of the first configuration and the total duration of the two successive configurations, this total duration being preferably fixed and predetermined.
- The value of the calculated duty cycle is transmitted in the form of a signal Sd and used by a "pulse-width modulation" (MLI) type circuit belonging to the control stage 150 and which controls the four transistors Q1, Q2, Q3, 105 successively according to the first configuration and then the second configuration and again according to the first configuration followed by the second configuration and so on until stoppage of the test. Such a stoppage may be triggered when a convergence criterion is met or a predetermined measurement duration is elapsed.

Figure 3:
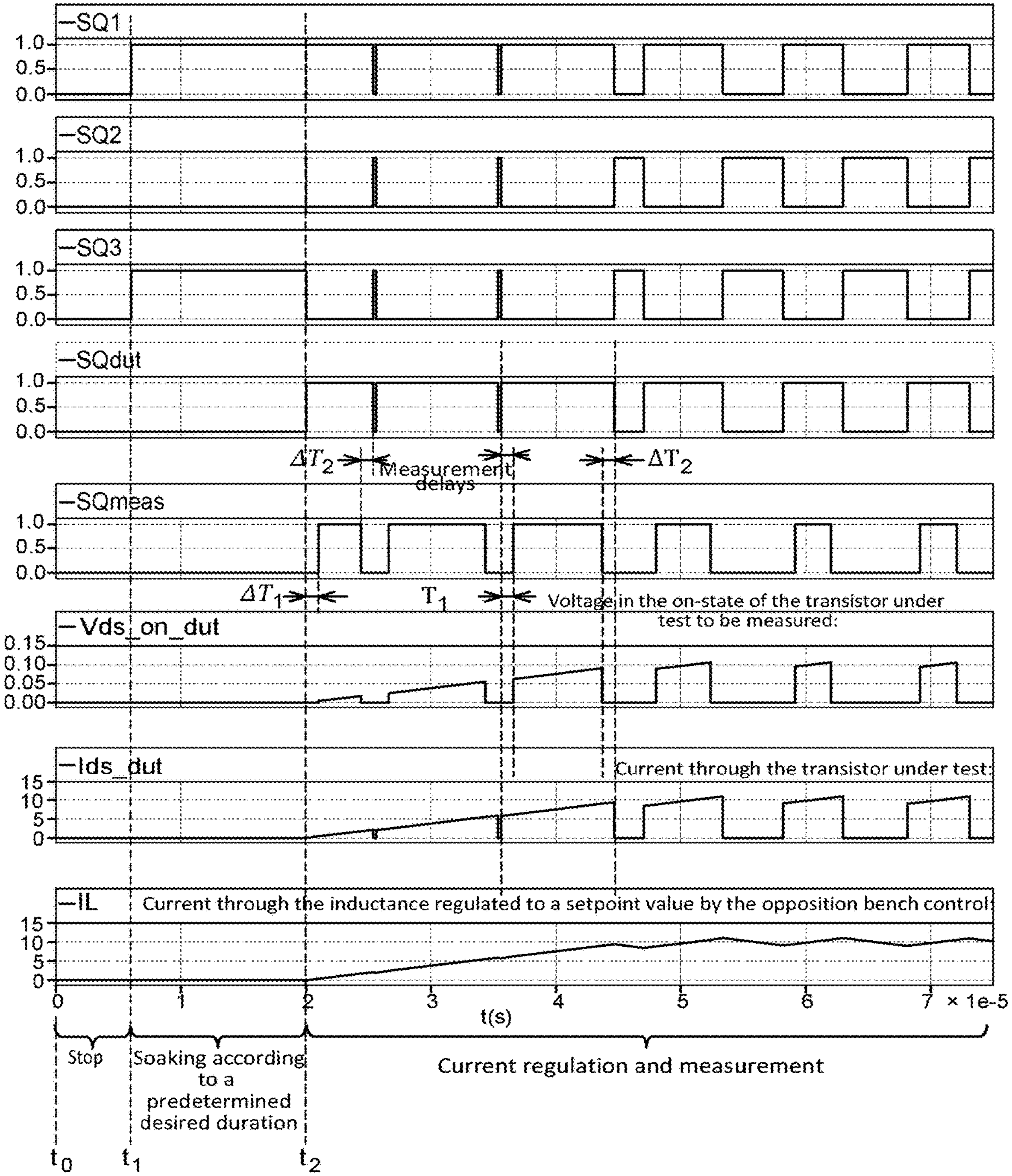
FIG. 3 gives an example of an operation time chart of the device of FIG. 2.

An example of operation of the test device with the different aforementioned phases of operation is illustrated in the time chart of FIG. 3, giving a possible assessment of the respective control signals SQ1, SQ2, SQ3 of the switch elements Q1, Q2, Q3, of the control signal $SQ_{DUT}$ of the transistor 105 being tested, of the measurement phase triggering signal SQmeas, of the voltage VDS_on_DUT of the GaN-based transistor 105, of the current $I_{DS\_DUT}$ of the GaN-based transistor 105, and of the current $I_L$ flowing through the inductive load 122 and flowing in the branch 120.

Prior to the so-called "soaking" operation phase (between a time point $t_0$ and a time point $t_1$), the device is in the stop phase and the signals SQ1, SQ2, SQ3, $SQ_{DUT}$, SQmeas are herein in a low state corresponding to a deactivated or non-conducting state of the transistors they respectively control.

Then, prior to a measurement phase, the soaking phase lasting a determined and adjustable duration is implemented.

For example, it is possible to provide for the duration of this phase lasting between one microsecond and several seconds and being set at a predetermined duration. This predetermined duration may be selected among different durations for example 1 μs, 2 μs, 2 s and 10 s depending on the characteristics of the transistor 105 being tested. The soaking duration may be adjusted from one measurement to another preformed on the same transistor 105 or on a next transistor replacing the transistor 105 in the second arm of the test circuit 110.

During this soaking phase, herein triggered at a time point $t_1$, the control signals $SQ_1$ and $SQ_3$ of the first switch element Q1 and of the third switch element Q3 are set in a first state, herein a high state, so as to make the first switch Q1 and the third switch Q3 conducting, whereas the second switch Q2 and the GaN-based transistor 105 are kept non-conducting via the control signals $SQ_1$ and SQdut kept in a second state, herein a low or deactivated state. Thus, said GaN-based transistor 105 is coupled to the power supply 102 whereas the nodes $N_A$ and $N_B$ are set at the same potential and in particular at the supply voltage. Thus, during this soaking phase, the supply voltage between the drain and the source of the transistor 105 is imposed.

Advantageously, the soaking and its duration are herein controlled without having to add additional arms to the test circuit 110 and without complicating the layout of this test circuit.

The soaking phase ends at a time point $t_2$ to start afterwards the current regulation and measurement phases.

The control signal $SQ_{DUT}$ of the transistor 105 being tested is then modified by the control stage 150 and in particular set in a state, herein a high state, so as to make the GaN transistor 105 conducting, in other words activate it. In turn, the signals SQ2, SQ3 of the second switch element Q2 and of the third switch element Q3 are kept in a low state so as to keep the second switch Q2 and the third switch element Q3 deactivated (i.e. non-conducting), whereas the signal $SQ_1$ is kept in a high state so as to keep the first switch element Q1 activated (i.e. conducting). The power supply 102, the branch 120 and the transistor 105 are then set in series. Thus, the test circuit 110 is in a first configuration corresponding to a first set of states of the switch elements Q1, Q2, Q3 and of the transistor 105.

To perform a measurement, the control signal SQmeas is modified and activated with an adjustable delay ΔT1 after the time point $t_2$ of start-up of the first configuration in order not to disturb the switching behavior of the transistor 105. Thus, the transistor $Q_{meas}$ of the measuring stage 130 may be armed or made conducting a delay ΔT1, for example ten nanoseconds, after the GaN transistor 105 is armed. The measuring stage 130 and in particular the amplifier Op-Amp is then connected to the terminals of the GaN transistor 105.

Then, once the measurement of the drain-source voltage Vds_on_dut of the transistor 105 is performed, the measuring stage 130 and in particular the amplifier Op-Amp is disconnected from the GaN transistor 105, by deactivating (i.e. blocking) the measuring switch $Q_{meas}$. Afterwards, the transistor 105 is disarmed (i.e. made non-conducting) a predetermined delay ΔT2 after deactivation of the switch $Q_{meas}$. The signals SQ1, SQ2, SQ3, respectively of the first switch element Q1, of the second switch element Q2 and of the third switch element Q3 are modified at the same time and respectively set in states so as to deactivate (i.e. block) the first switch Q1, and activate (i.e. make conducting) the second switch element Q2 and the third switch element Q3.

Thus, one could switch from the first configuration into a second configuration corresponding to a second set of states of the switch elements Q1, Q2, Q3 and of the transistor 105. In this second configuration, the power supply 102 and the branch 120 form a closed circuit.

The respective durations of the first configuration and of the second configuration depend on that one during which the measurement triggering signal SQmeas is activated, itself deduced from the signal SQdut, itself formed from the signal Sd supplied by the regulation stage. The signal SQmeas replicates the variations of the signal SQdut within the delay margins ΔT1 and ΔT2.

The switch $Q_{meas}$ is armed by the signal SQmeas (in other words, it is set in the ON or conducting state) at a later time after the transistor 105 being tested whose state is controlled by the signal SQdut and the switch $Q_{meas}$ is closed (in other words, it is set in the OFF state) at an earlier time before the transistor 105 to avoid a measurement disturbance related to switching of the transistor 105.

Thus, during this measurement phase, the control signals SQ1, SQ2, SQ3, $SQ_{DUT}$ alternate at least once and typically several times, between a first set of states and a second set of states, so that the test circuit 110 alternates several times between the first configuration and the second configuration.

Thus, the switch elements Q1, Q2, Q3 and 105 could be controlled according to an opposition method like that one described for example in the document "Use of Opposition method in the test of high-power electronic converters", by Forest et al., IEEE transaction on industrial electronics, 2006.

The total duration of the measurement phase may be adjusted according to a predetermined test duration or correspond to a predetermined number of switchings between the first configuration and the second configuration.

The end of the measurement phase may also be established when a convergence criterion is met. For example, such a convergence criterion may be such that, when upon completion of several measurement samples of $R_{DS\_ONdyn}$, the measured value of the measured resistance $R_{DS\_ONdyn}$ no longer varies by K %, for example with K=5, the end of the measurement phase is triggered.

The end of the measurement phase may also be triggered by a user of the test device, for example when he/she sees on a measuring instrument, such as an oscilloscope, that a convergence of the inductance current IL around the setpoint value is reached.

The characterization of the GaN-based transistor 105 and in particular the measurements of $I_{LOAD}$ of $V_{drop\_DS\_ON}$ in order to assess the resistance $R_{DS\_ON\_dyn}$ are typically carried out typically by heating the transistor 105 at a temperature which may be comprised for example between 25° C. and 175° C., to the extent that the operating temperature of the assessed transistor 105 is typically within this range.

Figure 4:
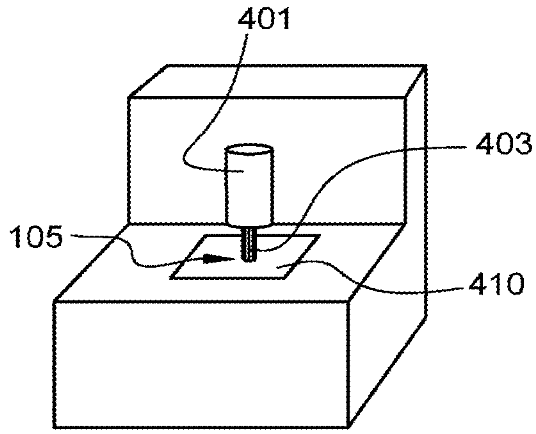
FIG. 4 is intended to illustrate an example of an infrared beam heating device for heating in a localized manner the GaN transistor when a measurement of the dynamic resistance in the conducting state of the latter is performed.

Preferably, a localized heating of the transistor 105 is implemented without significantly heating up the other elements of the measuring circuit, and in particular the switch elements Q1, Q2, Q3. For this purpose, heating may be done by means of an infrared radiation source 401 emitting an infrared beam 403 on the GaN transistor 105, like in the example of arrangement illustrated in FIG. 4. The transistor 105 may be arranged on a receiving support 410, for example in the form of a plate towards which the infrared beam is directed.

The exposure to the IR beam may be intermittent and dependent on the measurement of a temperature sensor, the intermittent control of the beam could be done for example by means of a PID (proportional, integral, derivative) regulator.

It is possible to provide for at least two distinct temperature sensors, a first one which measures the temperature of the transistor 105 and another sensor which measures the environment around. An insulating casing, such as a polyimide-based layer for example of the Kapton™ type may be used to protect the circuit around the transistor 105 when it is subjected to the infrared radiation.

The infrared beam may be an active beam, i.e. whose power can be modulated during exposure. A P.I.D (Proportional, Integral, Derivative) type control circuit could allow regulating the power of this beam. An example of a temperature profile of the transistor 105 includes a temperature rising ramp, then a constant temperature level, and then a falling ramp.

According to one embodiment, the previously-described measuring circuit is integrated on the receiving support 410 and it is the GaN transistor 105 which is affixed and removably arranged on this support 410 while being connected to the measuring circuit. Alternatively, it is possible to provide for a receiving support 410 dedicated to the transistor 105, the rest of the measuring circuit being connected to this support and to the transistor 105, but arranged on another support element.

Figure 5A:
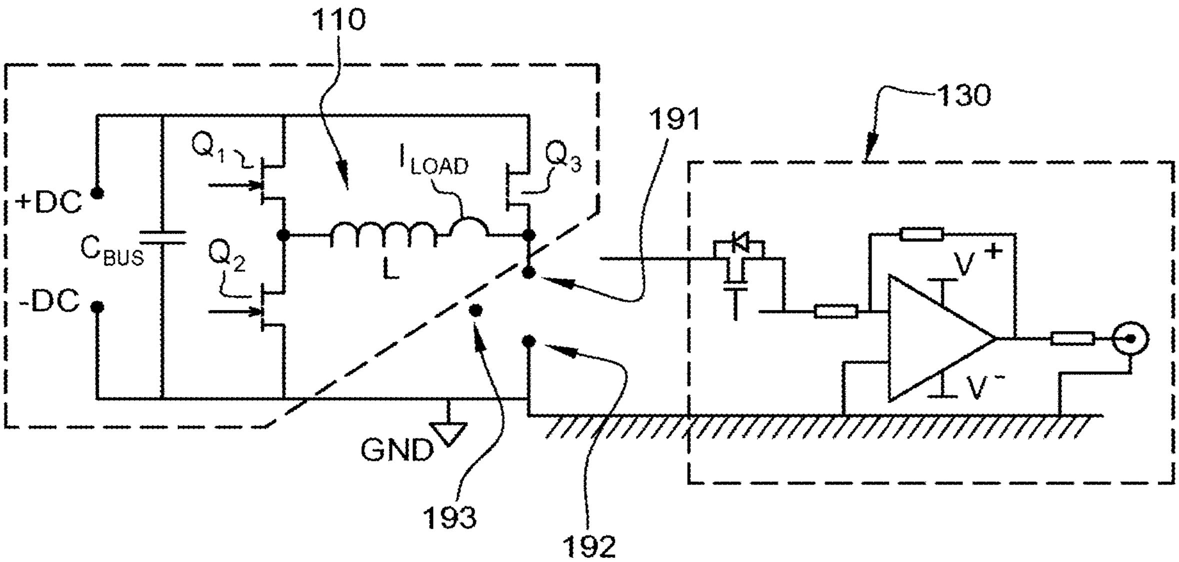
FIG. 5A is intended to illustrate an example of an arrangement of the connection areas in the test circuit and to which the GaN-based transistor could be temporarily and removably connected while an assessment of the dynamic resistance in the conducting state of this transistor is being carried out.

Thus, in the embodiment illustrated in FIG. 5A, the circuit 110 is provided with connection areas 191, 192, 193 (schematically shown in this figure) respectively of the source electrode, of the drain electrode and of the gate electrode of the GaN transistor (not shown). For example, the connection areas 191, 192, 193 may be in the form of conductive pads. When the transistor 105 is located on a wafer (wafer) including other transistors of the same type and which may be distributed over other electronic chips on which the transistor 105 is located, this transistor 105 is temporarily connected to the connection areas 191, 192, 193 and the resistance $R_{DS\_ONdyn}$ is assessed. Once the assessment is completed, the transistor 105 is disconnected from the connection areas 191, 192, 193 which are thus cleared and ready to be connected to another transistor to be tested and which could be on the same wafer (wafer) as the transistor 105.

Figure 5B:
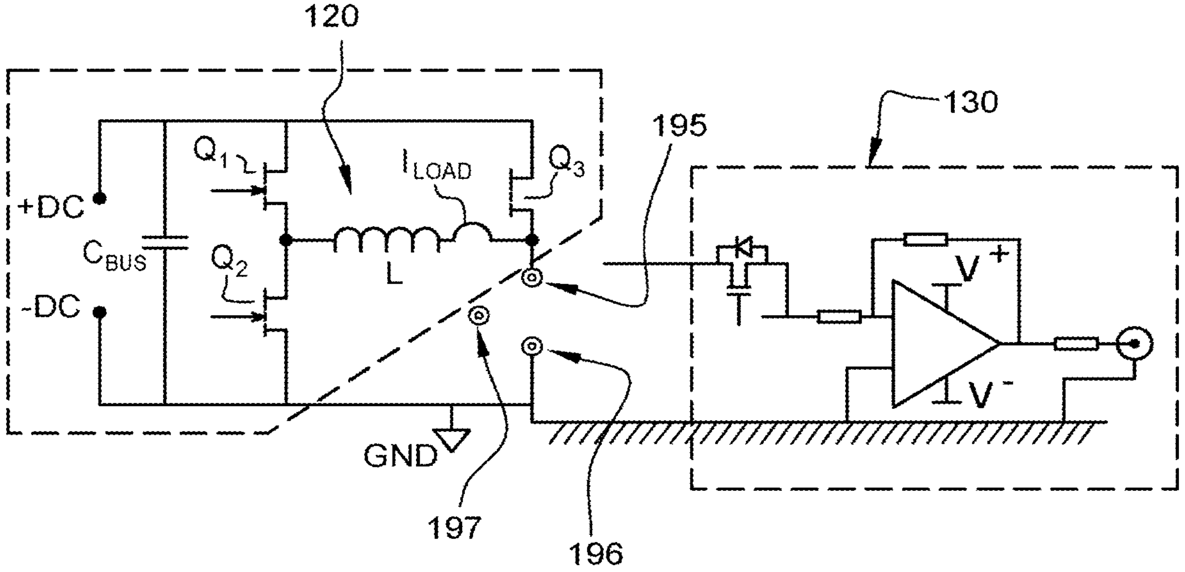
FIG. 5B is intended to illustrate an example of an arrangement of the connection and receiving structures of the test structure to which the GaN-based transistor could be temporarily and removably connected while an assessment of the dynamic resistance in the conducting state of this transistor is being carried out.

According to another variant, the circuit 110 may be provided with structures 195, 196, 197 for receiving and connecting (schematically shown in FIG. 5B) respectively the source electrode, the drain electrode and the gate electrode of the GaN transistor (not shown). For example, in the case where the transistor 105 is already embedded or mounted on a package, the transistor 105 is arranged on these receiving and connection structures 195, 196, 197 and the resistance $R_{DS\_ON\_dyn}$ is assessed. Once the assessment is completed, the transistor 105 is removed from the circuit 110 and the structures 195, 196, 197 are thus cleared so as to be able to receive another transistor to be tested, for example another transistor mounted on the package.

The tested GaN-based transistor 105 may be in an integrated form in an SMD (standing for "surface mounted device") package, or a through package, i.e. provided with connection pins, or a bare chip (i.e. with no package).

Figure 6:
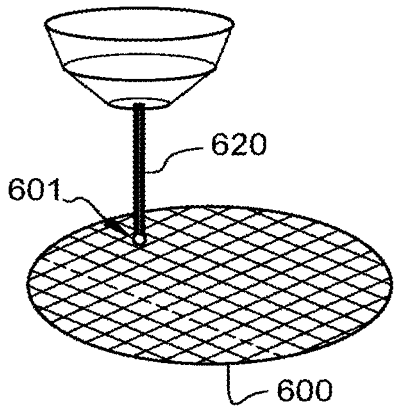
FIG. 6 is intended to illustrate a measurement performed when the GaN-based transistor is still arranged on the wafer (wafer) on which it has just been manufactured.

In the embodiment illustrated in FIG. 6, the measurement is performed directly on the wafer 600 ("wafer" according to the Anglo-Saxon terminology), even before this wafer is cut, the test circuit (not shown) being connected to the GaN transistor via conductive tips or contact pads.

To measure a package-less bare chip 601, the chip 601 is connected to connection structures (not shown) and this chip 601 is exposed to an infrared beam 620 preferably projected on a face opposite to that one on which the GaN transistor to be tested is arranged.

According to another aspect, the present application aims to protect a method for evaluating the dynamic resistance in the conducting state of a GaN transistor using a device as defined hereinabove, wherein the so-called "measurement" phase is stopped when a criterion of convergence of the current (IL) flowing through the inductive load is met or when a predetermined measurement duration is elapsed.

The invention claimed is:

1. A device for evaluating a dynamic resistance in a conducting state of a GaN-based transistor, comprising:

a test circuit having:

a first circuit arm, said first circuit arm being provided with a first switch element and with a second switch element connected together at a first node, said test circuit being provided with a third switch element connected to a second node, said third switch element being configured to form a second circuit arm of said test circuit that includes said GaN-based transistor when said GaN-based transistor is connected to the second node, a power supply configured to deliver a supply voltage to the first circuit arm and to the second circuit arm, a branch between the first node and the second node provided with an inductive load and with a current sensor to measure a current flowing through this said inductive load, a drain-source voltage measuring stage configured to measure a drain-source voltage of said GaN-based transistor, said drain-source voltage measuring stage being provided with a measuring switch to alternately connect said GaN-based transistor to a voltage measurement circuit of said drain-source voltage measuring stage during the conducting state of said GaN-based transistor, and disconnect said GaN-based transistor from said voltage measurement circuit of said drain-source voltage measuring stage when said measuring switch is set in a non-conducting state, and a control stage configured to control said first, second and third switch elements, said GaN-based transistor, and the measuring switch, the control stage being configured to:

according to a measurement phase, alternately set, once or several times, the test circuit in a first configuration, then in a second configuration, the first configuration being a configuration in which the first switch element and said GaN-based transistor are made conducting whereas the second switch element and the third switch element are made non-conducting, so as to set said power supply in series with said first switch element, said branch, and said GaN-based transistor, the second configuration being a configuration during which the second switch element and the third switch element are made conducting whereas the first switch element and said GaN-based transistor are made non-conducting so as to set said second switch element, said third switch element, and said branch in series with said power supply, the control stage being configured to control said measurement switch to trigger a connection of said voltage measurement circuit of the drain-source voltage measuring stage to said GaN-based transistor after the test circuit is set in the first configuration, and to control said measurement switch to trigger a disconnection of said voltage measurement circuit of the drain-source voltage measuring stage from said GaN-based transistor before the test circuit is set in the second configuration.

2. The device according to claim 1, wherein the control stage is further configured, prior to the measurement phase, to implement a soaking phase lasting an adjustable predetermined duration, by making the first switch element and the third switch element conducting whereas the second switch element and the GaN-based transistor are kept non-conducting so as to set the first node and the second node at said supply voltage.

3. The device according to claim 1, wherein the control stage is configured to trigger said connection of said voltage measurement circuit of the drain-source voltage measuring stage to said GaN-based transistor a first non-zero predetermined adjustable delay after the test circuit is set in the first configuration, and to trigger said disconnection of said voltage measurement circuit of the drain-source voltage measuring stage from said GaN-based transistor a second non-zero predetermined adjustable delay before the test circuit is set in the second configuration.

4. The device according to claim 1, wherein said voltage measurement circuit of the drain-source voltage measuring stage comprises an operational amplifier mounted as a follower and having a non-inverting input connected to a drain electrode of the GaN-based transistor.

5. The device according to claim 1, further comprising a regulation circuit, wherein the control stage is configured to trigger a switch from the first configuration into the second configuration or from the second configuration into the first configuration according to a variation of a signal originating from said regulation circuit for regulating the current of said inductive load, said signal generated by said regulation circuit being based on a comparison between said current flowing through the inductive load and a setpoint value.

6. The device according to claim 5, wherein the regulation circuit is configured to establish a difference between an averaged value of the current flowing through the inductive load and said setpoint, and includes a corrector stage, in particular of a proportional integral type, configured to calculate a duty cycle from said difference, said duty cycle, comprised between zero and one, being representative of a proportion between a duration of said first configuration and a total duration of the successive first configuration and second configuration, a value of the duty cycle being transmitted via said signal generated by said regulation circuit to a pulse-width modulation circuit of the control stage to control respective gates of the first switch element, the second switch element, the third switch element, and said GaN-based transistor.

7. The device according to claim 1, further comprising a heater configured to heat the GaN-based transistor, the heater being provided with an infrared radiation source configured to emit a localized infrared light beam on the GaN-based transistor.

8. The device according to claim 1, further comprising a support on which said test circuit is arranged, said support being provided with connection areas or structures on which a source electrode, and a drain electrode and a gate electrode of the GaN-based transistor being respectively connected in a removable manner.

9. The device according to claim 8, wherein the GaN-based transistor is embedded and/or mounted on a package and wherein said package is arranged on said support, the connection structures consisting of connection and receiving structures respectively configured to enable a secure assembly of the GaN-based transistor on said support.

10. The device according to claim 8, wherein the GaN-based transistor is arranged on a wafer including a plurality of electronic chips, each electronic chip being provided with at least one GaN-based transistor, and the GaN-based transistor being connected to said support of the test circuit.

11. A microelectronic method comprising at least one step of evaluating a dynamic resistance in a conducting state of a GaN-based transistor and based on a device comprising a test circuit and a support on which said test circuit is arranged, the test circuit having:

a first circuit arm, said first circuit arm being provided with a first switch element and with a second switch element connected together at a first node, said test circuit being provided with a third switch element connected to a second node, said third switch element being configured to form a second circuit arm of said test circuit that includes said GaN-based transistor when said GaN-based transistor is connected to the second node, a power supply configured to deliver a supply voltage to the first circuit arm and to the second circuit arm, a branch between the first node and the second node provided with an inductive load and with a current sensor to measure a current flowing through this said inductive load, a drain-source voltage measuring stage configured to measure a drain-source voltage of said GaN-based transistor, said drain-source voltage measuring stage being provided with a measuring switch to alternately connect said GaN-based transistor to a voltage measurement circuit of said drain-source voltage measuring stage during the conducting state of said GaN-based transistor, and disconnect said GaN-based transistor from said voltage measurement circuit of said drain-source voltage measuring stage when said measuring switch is set in a non-conducting state, and a control stage configured to control said first, second and third switch elements, said GaN-based transistor, and the measuring switch, the control stage being configured to:

according to a measurement phase, alternately set, once or several times, the test circuit in a first configuration, then in a second configuration, the first configuration being a configuration in which the first switch element and said GaN-based transistor are made conducting whereas the second switch element and the third switch element are made non-conducting, so as to set said power supply in series with said first switch element, said branch, and said GaN-based transistor, the second configuration being a configuration during which the second switch element and the third switch element are made conducting whereas the first switch element and said GaN-based transistor are made non-conducting so as to set said second switch element, said third switch element, and said branch in series with said power supply, the control stage being configured to control said measurement switch to trigger a connection of said voltage measurement circuit of the drain-source voltage measuring stage to said GaN-based transistor after the test circuit is set in the first configuration, and to control said measurement switch to trigger a disconnection of said voltage measurement circuit of the drain-source voltage measuring stage from said GaN-based transistor before the test circuit is set in the second configuration, said support being provided with connection areas or structures on which a source electrode, and a drain electrode and a gate electrode of the GaN-based transistor being respectively connected in a removable manner, and the GaN-based transistor being arranged on a wafer including a plurality of electronic chips, each electronic chip being provided with at least one GaN-based transistor, and the GaN-based transistor being connected to said support of the test circuit, the method comprising:

connecting the GaN-based transistor to said connection areas in order to assess drain-source dynamic resistance of the GaN-based transistor in the conducting state; then disconnecting the GaN-based transistor from said connection areas; and then cutting the wafer in order to separate said electronic chips.

12. A method for evaluating dynamic resistance in a conducting state of a GaN-based transistor using a device comprising a test circuit having:

a first circuit arm, said first circuit arm being provided with a first switch element and with a second switch element connected together at a first node, said test circuit being provided with a third switch element connected to a second node, said third switch element being configured to form a second circuit arm of said test circuit that includes said GaN-based transistor when said GaN-based transistor is connected to the second node, a power supply configured to deliver a supply voltage to the first circuit arm and to the second circuit arm, a branch between the first node and the second node provided with an inductive load and with a current sensor to measure a current flowing through this said inductive load, a drain-source voltage measuring stage configured to measure a drain-source voltage of said GaN-based transistor, said drain-source voltage measuring stage being provided with a measuring switch to alternately connect said GaN-based transistor to a voltage measurement circuit of said drain-source voltage measuring stage during the conducting state of said GaN-based transistor, and disconnect said GaN-based transistor from said voltage measurement circuit of said drain-source voltage measuring stage when said measuring switch is set in a non-conducting state, and a control stage configured to control said first, second and third switch elements, said GaN-based transistor, and the measuring switch, the control stage being configured to:

according to a measurement phase, alternately set, once or several times, the test circuit in a first configuration, then in a second configuration, the first configuration being a configuration in which the first switch element and said GaN-based transistor are made conducting whereas the second switch element and the third switch element are made non-conducting, so as to set said power supply in series with said first switch element, said branch, and said GaN-based transistor, the second configuration being a configuration during which the second switch element and the third switch element are made conducting whereas the first switch element and said GaN-based transistor are made non-conducting so as to set said second switch element, said third switch element, and said branch in series with said power supply and the control stage being configured to control said measurement switch to trigger a connection of said voltage measurement circuit of the drain-source voltage measuring stage to said GaN-based transistor after the test circuit is set in the first configuration, and to control said measurement switch to trigger a disconnection of said voltage measurement circuit of the drain-source voltage measuring stage from said GaN-based transistor before the test circuit is set in the second configuration, the method comprising:

stopping the measurement phase when a criterion of convergence throughout the inductive load is met or a predetermined measurement duration is elapsed.

* * * * *